(12) United States Patent
Nakamura

(10) Patent No.: US 12,543,505 B2
(45) Date of Patent: Feb. 3, 2026

(54) METHOD OF MANUFACTURING MAGNETORESISTIVE ELEMENT, OXIDATION PROCESSING APPARATUS, AND SUBSTRATE PROCESSING SYSTEM

(71) Applicant: TOKYO ELECTRON LIMITED, Tokyo (JP)

(72) Inventor: Kanto Nakamura, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 405 days.

(21) Appl. No.: 18/026,084

(22) PCT Filed: Sep. 10, 2021

(86) PCT No.: PCT/JP2021/033350
§ 371 (c)(1),
(2) Date: Mar. 13, 2023

(87) PCT Pub. No.: WO2022/065081
PCT Pub. Date: Mar. 31, 2022

(65) Prior Publication Data
US 2023/0371391 A1    Nov. 16, 2023

(30) Foreign Application Priority Data

Sep. 23, 2020   (JP) ................................. 2020-158389

(51) Int. Cl.
*H10N 50/01*   (2023.01)
*C23C 14/14*   (2006.01)
*C23C 14/34*   (2006.01)
(Continued)

(52) U.S. Cl.
CPC ............. *H10N 50/01* (2023.02); *C23C 14/14* (2013.01); *C23C 14/34* (2013.01);
(Continued)

(58) Field of Classification Search
CPC ........ H10N 50/01; H10N 50/20; H10N 50/85; H10N 50/10; H10B 61/00; C23C 14/14;
(Continued)

(56) References Cited

U.S. PATENT DOCUMENTS 10,461,249 B2    10/2019  Hosoya et al.
2007/0178608 A1   8/2007  Sun et al.
(Continued)

FOREIGN PATENT DOCUMENTS

JP    2001-203408 A    7/2001
JP    2016-134510 A    7/2016
(Continued)

OTHER PUBLICATIONS

PCT International Search Report and Written Opinion, PCT Application No. PCT/JP2021/033350, Nov. 22, 2021, 9 pages (with English translation of PCT International Search Report).

*Primary Examiner* — Omar F Mojaddedi
(74) *Attorney, Agent, or Firm* — Fenwick & West LLP

(57) ABSTRACT

There is provided a method of manufacturing a magnetoresistive element. The method comprises: (a) placing a substrate on a substrate support of an oxidation processing apparatus, the substrate having a ferromagnetic layer and a magnesium layer provided on the ferromagnetic layer; and (b) oxidizing the magnesium layer by supplying oxygen gas to the substrate in a state where a temperature of the substrate support is set to 150 Kelvin or less to form a magnesium oxide layer from the magnesium layer.

4 Claims, 9 Drawing Sheets

(51) Int. Cl.
   *C23C 14/58* (2006.01)
   *H10B 61/00* (2023.01)
   *H10N 50/20* (2023.01)
   *H10N 50/85* (2023.01)

(52) U.S. Cl.
   CPC ......... *C23C 14/5853* (2013.01); *H10B 61/00* (2023.02); *H10N 50/20* (2023.02); *H10N 50/85* (2023.02)

(58) Field of Classification Search
   CPC ... C23C 14/34; C23C 14/5853; C23C 14/165; C23C 14/568; C23C 14/5806
   See application file for complete search history.

(56) References Cited

U.S. PATENT DOCUMENTS

| | | | | |
|---|---|---|---|---|
| 2011/0227018 | A1* | 9/2011 | Kuribayashi | H10N 50/85 257/E21.09 |
| 2016/0005958 | A1* | 1/2016 | Seino | H10N 50/85 438/3 |
| 2017/0110657 | A1 | 4/2017 | Park et al. | |
| 2017/0130330 | A1* | 5/2017 | Nardi | C23C 16/45534 |
| 2017/0317273 | A1* | 11/2017 | Kitada | H10N 50/10 |
| 2018/0090673 | A1* | 3/2018 | Sasaki | H10N 50/80 |
| 2018/0331280 | A1* | 11/2018 | Hosoya | H10N 50/01 |
| 2019/0123262 | A1 | 4/2019 | Lee et al. | |
| 2019/0355900 | A1 | 11/2019 | Kim et al. | |

FOREIGN PATENT DOCUMENTS

| | | |
|---|---|---|
| KR | 10-2017-0107000 A | 9/2017 |
| KR | 10-2019-0045639 A | 5/2019 |
| WO | WO 2010/026705 A1 | 3/2010 |
| WO | WO 2016/114900 A1 | 7/2016 |
| WO | WO 2017/134697 A1 | 8/2017 |

* cited by examiner

METHOD OF MANUFACTURING MAGNETORESISTIVE ELEMENT, OXIDATION PROCESSING APPARATUS, AND SUBSTRATE PROCESSING SYSTEM

TECHNICAL FIELD

Exemplary embodiments of the present disclosure relate to a method of manufacturing a magnetoresistive element, an oxidation processing apparatus, and a substrate processing system.

BACKGROUND

A magnetoresistive element is used in a device such as a hard disk drive or a MRAM (Magnetoresistive Random Access Memory). A tunnel magnetoresistive element having a tunnel barrier layer made of magnesium oxide is known to exhibit a high MR ratio (magnetoresistance ratio). A tunnel magnetoresistive element has a tunnel barrier layer between two ferromagnetic layers.

In manufacturing magnetoresistive elements, a magnesium layer is formed on a substrate having one of the two ferromagnetic layers. The magnesium layer is oxidized using oxygen gas. Patent Document 1 below discloses a technique for forming a magnesium oxide layer of a magnetoresistive element.

PRIOR ART DOCUMENTS

Patent Documents

Patent Document 1: Japanese Laid-open Patent Publication No. 2016-134510

SUMMARY

Problems to Be Resolved by the Invention

The present disclosure provides a technique for suppressing oxidation of an underlying ferromagnetic layer in forming a magnesium oxide layer.

Means for Solving the Problems

In one exemplary embodiment, a method for manufacturing a magnetoresistive element is provided. The manufacturing method includes step (a) of mounting a substrate on a substrate support of an oxidation processing apparatus. The substrate has a ferromagnetic layer and a magnesium layer. The magnesium layer is provided on the ferromagnetic layer.

The method further includes step (b) of oxidizing the magnesium layer by supplying oxygen gas to the substrate in a state where a temperature of the substrate support is set to 150 Kelvin or less, so as to form a magnesium oxide layer from the magnesium layer.

Effect of the Invention

According to one exemplary embodiment, it is possible to suppress oxidation of the underlying ferromagnetic layer in forming the magnesium oxide layer.

DETAILED DESCRIPTION

Figure 1:
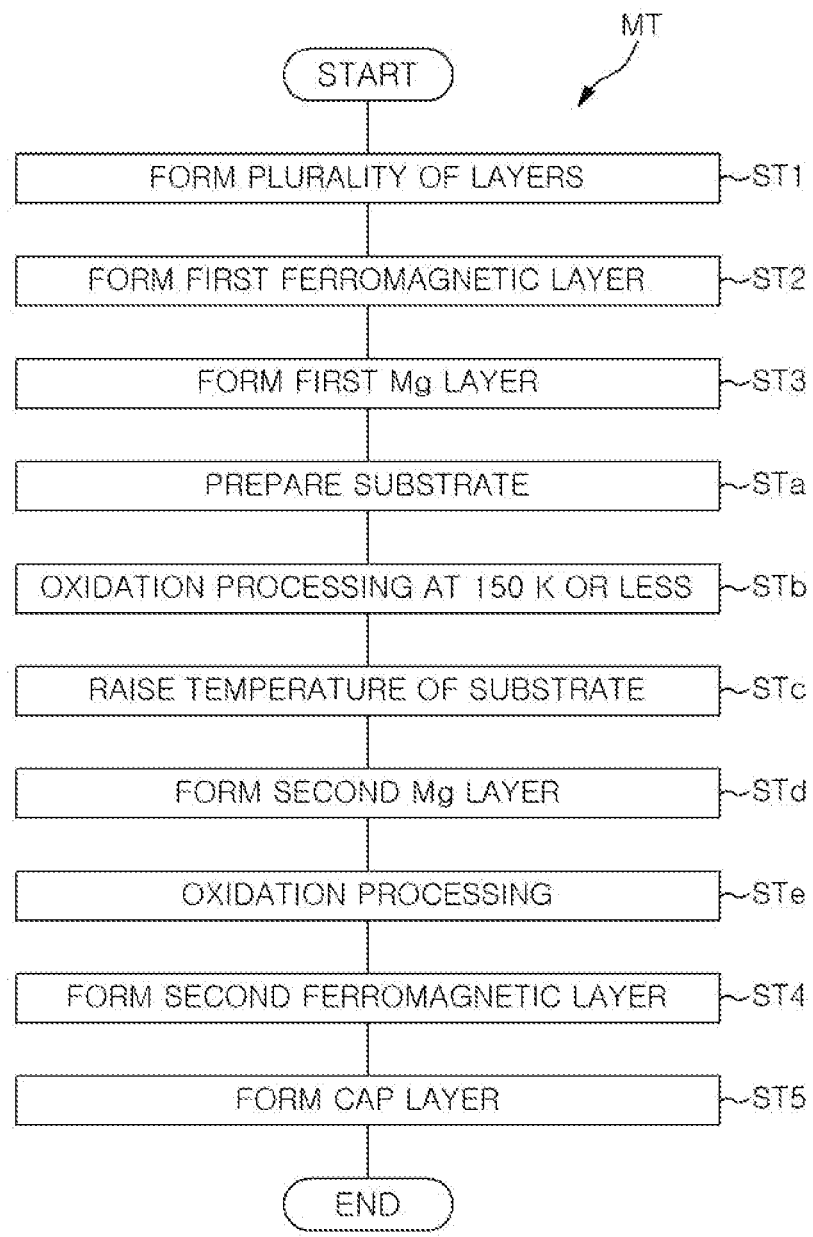
FIG. 1 is a flowchart of a method of manufacturing a magnetoresistive element according to one exemplary embodiment.

Various exemplary embodiments are described below.

In one exemplary embodiment, a method of manufacturing a magnetoresistive element is provided. The manufacturing method includes (a) placing a substrate on a substrate support of an oxidation processing apparatus. The substrate has a ferromagnetic layer and a magnesium layer. The magnesium layer is provided on the ferromagnetic layer. The manufacturing method further includes (b) oxidizing the magnesium layer by supplying oxygen gas to the substrate in a state where a temperature of the substrate support is set to 150 Kelvin or less to form a magnesium oxide layer from the magnesium layer.

In the manufacturing method of the embodiment, when the magnesium layer is oxidized using oxygen gas, the temperature of the substrate support is set to a low temperature of 150 Kelvin or less. Thus, in the manufacturing method of the embodiment, the controllability of an oxidation rate of the substrate in a depth direction is high. Therefore, according to the manufacturing method of the embodiment, it is possible to suppress oxidation of the ferromagnetic layer underlying the magnesium layer.

In one exemplary embodiment, the substrate may be rotated in the (b).

In one exemplary embodiment, the manufacturing method may further comprise (c) increasing a temperature of the substrate after the (b).

In one exemplary embodiment, the manufacturing method may further comprise (d) forming another magnesium layer on the magnesium oxide layer after the (c). The manufacturing method may further comprise (e) supplying oxygen gas to the substrate having said another magnesium layer to oxidize said another magnesium layer. The temperature of the substrate in the (e) is higher than the temperature of the substrate in the (b). According to this embodiment, the crystallinity of the magnesium oxide layer is enhanced.

In another exemplary embodiment, an oxidation processing apparatus is provided. An oxidation processing apparatus comprises a chamber, a substrate support, and a chiller. The substrate support is configured to support a substrate within the chamber. The chiller is configured to cool the substrate support to a temperature of 150 Kelvin or less. The gas supply is configured to supply oxygen gas into the chamber. The oxidation processing apparatus is configured to supply oxygen gas into the chamber from the gas supply in a state where the substrate support on which the substrate having a ferromagnetic layer and a magnesium layer provided on the ferromagnetic layer is placed is cooled to the temperature of 150 Kelvin or less.

In one exemplary embodiment, the oxidation processing apparatus may further comprise a driving mechanism configured to rotate the substrate support.

In another exemplary embodiment, a substrate processing system is provided. The substrate processing system comprises a plurality of process modules and a transfer module. The transfer module comprises a vacuum chamber and a transfer device. The vacuum chamber is connected to the plurality of process modules. The transfer device is configured to transfer a substrate via the vacuum chamber between any two process modules of the plurality of process modules. The plurality of process modules comprises a film forming apparatus and an oxidation processing apparatus. The film forming apparatus is configured to form a magnesium layer on a ferromagnetic layer of the substrate. The oxidation processing apparatus is an oxidation processing apparatus according to any one of the above-described exemplary embodiments, and is configured to supply oxygen gas to the substrate in a state where a temperature of the substrate support is set to 150 Kelvin or less to form a magnesium oxide layer from the magnesium layer.

In one exemplary embodiment, the plurality of process modules may comprise one or more process modules configured to heat the substrate, form another magnesium layer on the magnesium oxide layer, and oxidize said another magnesium layer. The one or more process modules are configured to set a temperature of the substrate to a temperature higher than a temperature of the substrate in the oxidation processing apparatus.

Various exemplary embodiments are described in detail below with reference to the drawings. The same reference numeral is given to a component which is the same or equivalent in each drawing.

FIG. 1 is a flowchart of a method of manufacturing a magnetoresistive element according to one exemplary embodiment. The manufacturing method shown in FIG. 1 (hereinafter, referred to as a "method MT") is performed to manufacture a magnetoresistive element.

Figure 2:
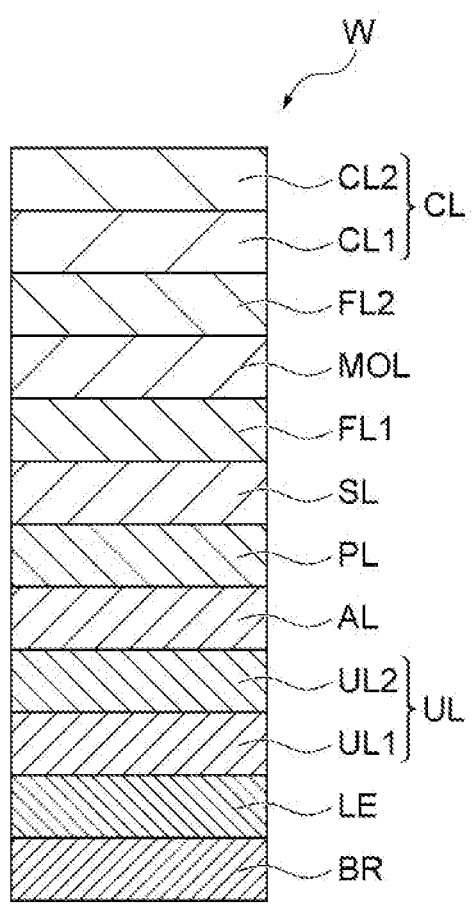
FIG. 2 is a partially enlarged cross-sectional view of an exemplary substrate including a magnetoresistive element.

FIG. 2 is a partially enlarged cross-sectional view of an exemplary substrate including a magnetoresistive element. The method MT can be applied to manufacture a magnetoresistive element in a substrate W shown in FIG. 2. The substrate W includes a base region BR, a lower electrode LE, an underlying layer UL, an antiferromagnetic layer AL, a pinned layer PL, a spacer layer SL, a first ferromagnetic layer FL1, a magnesium oxide layer MOL, a second ferromagnetic layer FL2, and a cap layer CL.

The lower electrode LE is provided on the base region BR. The underlying layer UL is provided on the lower electrode LE. The underlying layer UL may include a first underlying layer UL1 and a second underlying layer UL2. The first underlying layer UL1 is provided on the lower electrode LE and is made of Ta, for example. The second underlying layer UL2 is provided on the first underlying layer UL1 and is made of Ru, for example. The antiferromagnetic layer AL is provided on the underlying layer UL. The antiferromagnetic layer AL is made of IrMn, PtMn, or the like. The pinned layer PL is provided on the antiferromagnetic layer AL. The pinned layer PL is made of a ferromagnetic material such as CoFe. The spacer layer SL is provided on the pinned layer PL. The spacer layer SL is made of Ru, Rh, Ir, or the like.

The first ferromagnetic layer FL1 is provided on the spacer layer SL. The first ferromagnetic layer FL1 is a reference layer and is made of a ferromagnetic material such as CoFeB, CoFe, or a combination of CoFeB and CoFe. The magnesium oxide layer MOL is provided on the first ferromagnetic layer FL1 and is made of magnesium oxide. The second ferromagnetic layer FL2 is provided on the magnesium oxide layer MOL. The second ferromagnetic layer FL2 is a storage layer and is made of a ferromagnetic material such as CoFeB, CoFe, or a combination of CoFeB and CoFe. The cap layer CL is provided on the second ferromagnetic layer FL2.

The cap layer CL may include a first cap layer CL1 and a second cap layer CL2. The first cap layer CL1 is provided on the second ferromagnetic layer FL2. The second cap layer CL2 is provided on the first cap layer CL1. The first cap layer CL1 and the second cap layer CL2 can be made of a material that easily absorbs boron from the underlying layers when the substrate W is annealed. For example, the first cap layer CL1 is made of Ta and the second cap layer CL2 is made of Ru.

Refer to FIG. 1 again. The method MT starts with step ST1. In step ST1, a plurality of layers including the lower electrode LE, the underlying layer UL, the antiferromagnetic layer AL, the pinned layer PL, and the spacer layer SL are formed on the base region BR. The lower electrode LE, the underlying layer UL, the antiferromagnetic layer AL, the pinned layer PL, and the spacer layer SL are formed by, for example, physical vapor deposition (or sputtering) using one or more film forming apparatuses.

In subsequent step ST2, the first ferromagnetic layer FL1 is formed on the spacer layer SL. The first ferromagnetic layer FL1 is formed by, for example, physical vapor deposition (or sputtering) using a film forming apparatus.

Figure 3:
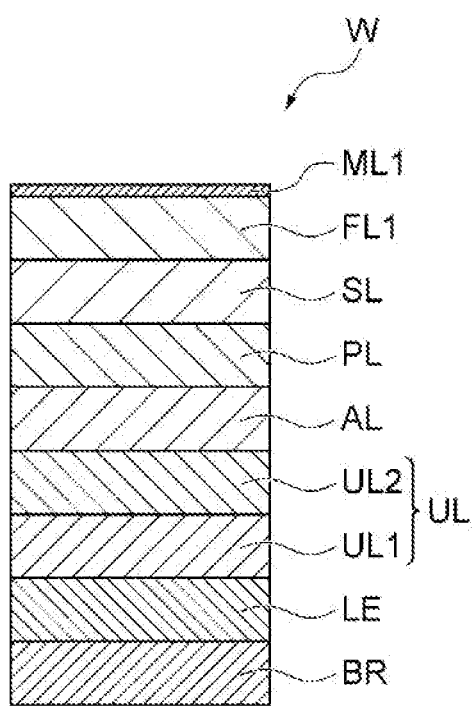
FIG. 3 is a partially enlarged cross-sectional view of an exemplary substrate in a state after forming of a first magnesium layer.

In subsequent step ST3, a first magnesium layer ML1 (first Mg layer) is formed on the first ferromagnetic layer FL1 as shown in FIG. 3. The first magnesium layer ML1 is made of magnesium. The first magnesium layer ML1 is formed by, for example, physical vapor deposition (or sputtering) using a film forming apparatus.

In subsequent step STa, the substrate W (see FIG. 3) having the first magnesium layer ML1 is prepared on a substrate support of an oxidation processing apparatus. The substrate W is placed on and supported by the substrate support.

Figure 4:
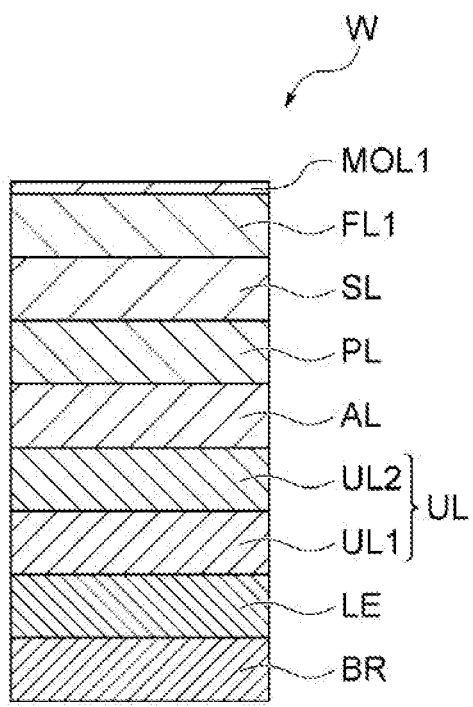
FIG. 4 is a partially enlarged cross-sectional view of an exemplary substrate in a state after oxidation processing.

In subsequent step STb, the oxidation processing is performed on the first magnesium layer ML1. In step STb, oxygen gas is supplied to the substrate W while a temperature of the substrate support is set to 150 Kelvin (−123.15° C.) or less. As a result, the first magnesium layer ML1 is oxidized to form a first magnesium oxide layer MOL1 from the first magnesium layer ML1, as shown in FIG. 4. In step STb, the substrate support may be rotated to rotate the substrate W around its central axis.

In subsequent step STc, a temperature of the substrate W is raised. In step STc, the temperature of the substrate W may be raised using a film forming apparatus used in step STd, which will be described later. Alternatively, in step STc, the temperature of the substrate W may be raised using a heating device different from the film forming apparatus used in step STd.

Figure 5:
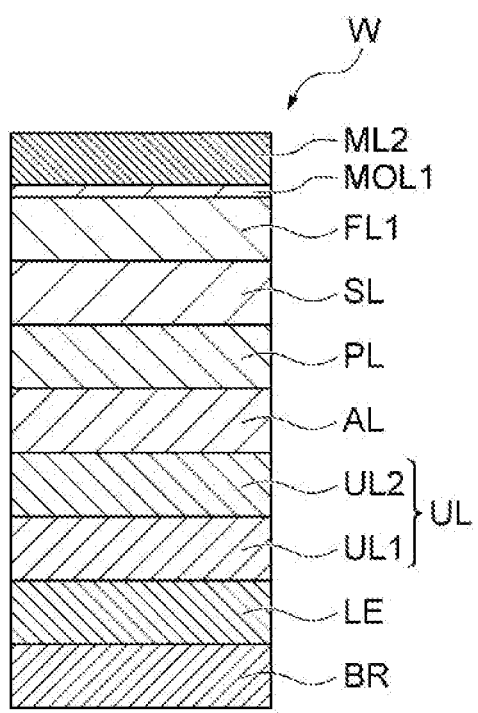
FIG. 5 is a partially enlarged cross-sectional view of an exemplary substrate in a state after forming a second magnesium layer.

In subsequent step STd, another magnesium layer, that is, a second magnesium layer ML2 (second Mg layer) is formed on the first magnesium oxide layer MOL1 as shown in FIG. 5. The second magnesium layer ML2 is made of magnesium. The second magnesium layer ML2 is formed by, for example, physical vapor deposition (or sputtering) using a film forming apparatus.

Figure 6:
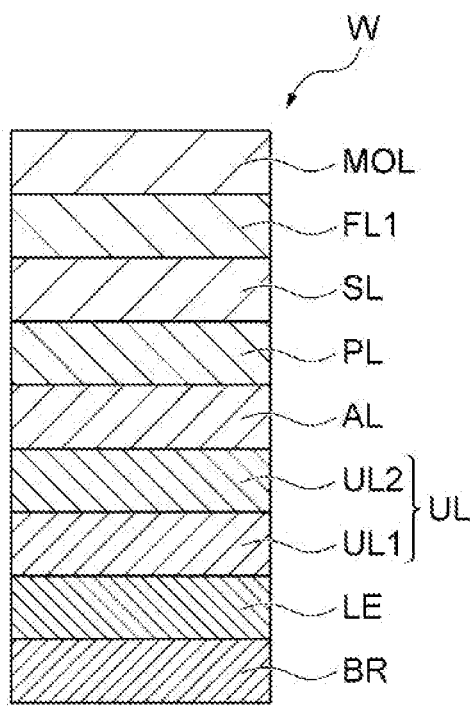
FIG. 6 is a partially enlarged cross-sectional view of an exemplary substrate in a state after oxidation processing.

In subsequent step STe, the oxidation processing is performed on the second magnesium layer ML2. In step STe, oxygen gas is supplied to the substrate W. The temperature of the substrate W in step STe is set higher than the temperature of the substrate W in step STb. In step STe, the substrate support supporting the substrate W may be rotated to rotate the substrate W around its central axis. In step STe, the second magnesium layer ML2 is oxidized to form a magnesium oxide layer from the second magnesium layer ML2. The magnesium oxide layer formed from the second magnesium layer ML2 constitutes the magnesium oxide layer MOL together with the first magnesium oxide layer MOL1, as shown in FIG. 6.

In subsequent step ST4, the second ferromagnetic layer FL2 is formed on the magnesium oxide layer MOL. The second ferromagnetic layer FL2 is formed by, for example, physical vapor deposition (or sputtering) using a film forming apparatus.

In subsequent step ST5, the cap layer CL is formed on the second ferromagnetic layer FL2. The cap layer CL is formed by, for example, physical vapor deposition (or sputtering) using a film forming apparatus.

In the method MT, the temperature of the substrate support is set to a low temperature of 150 Kelvin or less during oxidation of the first magnesium layer ML1 using oxygen gas. Thus, in the method MT, the controllability of an oxidation rate of the substrate W in a depth direction is high. Therefore, according to the method MT, it is possible to suppress oxidation of the first ferromagnetic layer FL1 underlying the first magnesium layer ML1. According to this method MT, a magnetoresistive element having a low resistance area product (RA) and a high MR ratio is manufactured.

Further, the temperature of the substrate W in step STe is higher than the temperature of the substrate W in step STb. According to step STe, the crystallinity of the magnesium oxide layer MOL is enhanced.

Figure 7:
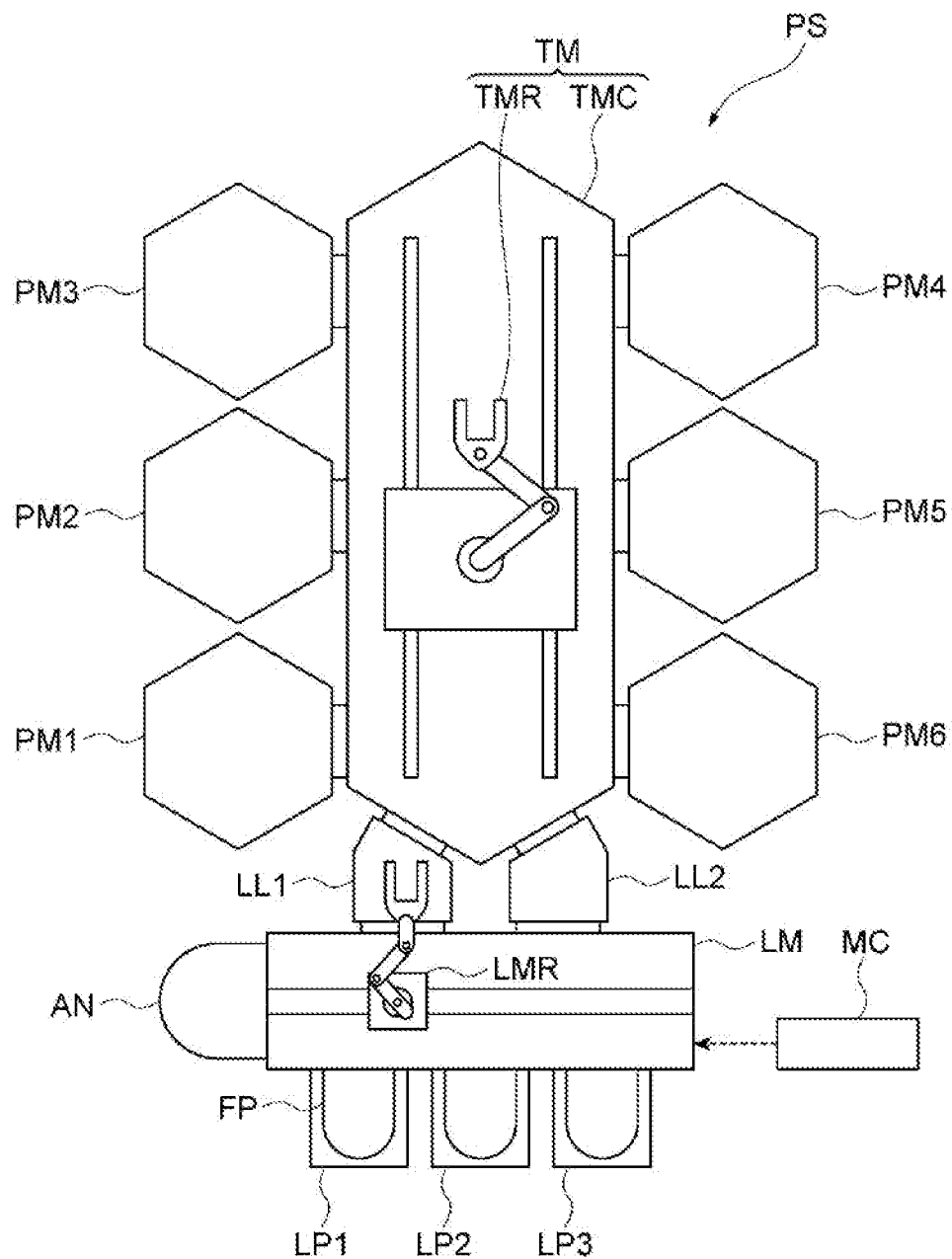
FIG. 7 is a diagram showing a substrate processing system according to one exemplary embodiment.

A substrate processing system that can be used in the method MT will now be described. FIG. 7 is a diagram showing a substrate processing system according to one exemplary embodiment. A substrate processing system PS shown in FIG. 7 can be used in the method MT.

The substrate processing system PS includes load ports LP1 to LP3, a plurality of containers FP, a loader module LM, an aligner AN, load lock modules LL1 and LL2, process modules PM1 to PM6, a transfer module TM, and a controller MC. The number of load ports, the number of containers, and the number of load lock modules in the substrate processing system PS may be one or more. Further, the number of process modules in the substrate processing system PS is not limited to six.

The load ports LP1 to LP3 are arranged along one edge of the loader module LM. The plurality of containers FP are mounted on the load ports LP1 to LP3. Each of the plurality of containers FP may be a container called a front opening unified pod (FOUP). Each of the plurality of containers FP is configured to accommodate the substrate W therein.

The loader module LM has a chamber. Pressure in the chamber of the loader module LM is set to atmospheric pressure. The loader module LM has a transfer device LMR. The transfer device LMR is, for example, an articulated robot and is controlled by the controller MC. The transfer device LMR is configured to transfer the substrate W through the chamber of the loader module LM. The transfer device LMR can transfer the substrate W between each of the plurality of containers FP and the aligner AN, between the aligner AN and each of the load lock modules LL1 and LL2, and between each of the load lock modules LL1 and LL2 and each of the plurality of containers FP. The aligner AN is connected to the loader module LM. The aligner AN is configured to adjust (calibrate) the position of the substrate W.

Each of the load lock module LL1 and the load lock module LL2 is provided between the loader module LM and the transfer module TM. Each of the load lock module LL1 and the load lock module LL2 provides a preliminary decompression chamber.

The transfer module TM is connected to each of the load lock module LL1 and the load lock module LL2 via gate valves. The transfer module TM has a vacuum chamber TMC. The vacuum chamber TMC is configured such that its inner space can be decompressed. The transfer module TM has a transfer device TMR. The transfer device TMR is, for example, an articulated robot and is controlled by the controller MC. The transfer device TMR is configured to transfer the substrate W through the vacuum chamber TMC. The transfer device TMR can transfer the substrate W between each of the load lock modules LL1 and LL2 and each of the process modules PM1 to PM6 and between any two process modules among the process modules PM1 to PM6.

Each of the process modules PM1 to PM6 is an apparatus configured to perform dedicated substrate processing. One of the process modules PM1 to PM6 is an oxidation processing apparatus used in step STb of the method MT. Other process modules among the process modules PM1 to PM6 include one or more film forming apparatuses. Other process modules among the process modules PM1 to PM6 may include an etching apparatus. In the following description, it is assumed that the substrate processing system PS has a configuration in which the process module PM1 is an etching apparatus, the process modules PM2, PM3, PM5, and PM6 are film forming apparatuses, and the process module PM4 is an oxidation processing apparatus. However, the substrate processing system PS may have other configurations.

The controller MC is configured to control each component of the substrate processing system PS. The controller MC may be a computer including a processor, a storage device, an input device, a display device, and the like. The controller MC executes a control program stored in the storage device and controls each component of the substrate processing system PS based on recipe data stored in the storage device. The method MT can be performed in the substrate processing system PS by controlling each component of the substrate processing system PS by the controller MC.

In step ST1 of the method MT, the underlying layer UL and the antiferromagnetic layer AL are formed in the process module PM2. The process module PM2 forms the underlying layer UL and the antiferromagnetic layer AL by physical vapor deposition (or sputtering).

In step ST1, the pinned layer PL and the spacer layer SL are formed in the process module PM3. The process module PM3 forms the pinned layer PL and the spacer layer SL by physical vapor deposition (or sputtering). After the formation of the antiferromagnetic layer AL and before the formation of the pinned layer PL, the substrate W is transferred from the process module PM2 to the process module PM3 by the transfer device TMR of the transfer module TM.

In step ST2, the first ferromagnetic layer FL1 is formed in the process module PM3. In step ST3, the first magnesium layer ML1 is formed in the process module PM3. The process module PM3 forms the first ferromagnetic layer FL1 and the first magnesium layer ML1 by physical vapor deposition (or sputtering).

In step STa, the substrate W is transferred from the process module PM3 to the process module PM4 by the transfer device TMR of the transfer module TM, and then prepared on the substrate support of the process module PM4 (oxidation processing apparatus).

In step STb, the process module PM4 supplies oxygen gas to the substrate W in a state where the substrate support has been cooled to a temperature of 150 Kelvin or less. The process module PM4 oxidizes the first magnesium layer ML1 to form the first magnesium oxide layer MOL1 from the first magnesium layer ML1.

Before performing step STc, the substrate W is transferred from the process module PM4 to the process module PM5 by the transfer device TMR of the transfer module TM. In step STc, the process module PM5 raises the temperature of the substrate W.

In step STd, the second magnesium layer ML2 is formed in the process module PM5. The process module PM5 forms the second magnesium layer ML2 by physical vapor deposition (or sputtering).

In step STe, the process module PM5 supplies oxygen gas to the substrate W. The process module PM5 sets the temperature of the substrate W in step STe to a temperature higher than the temperature of the substrate W in step STb. The process module PM5 oxidizes the second magnesium layer ML2 to obtain the magnesium oxide layer MOL. Steps STc to STe may be performed using two or more process modules instead of one process module.

Before performing step ST4, the substrate W is transferred from the process module PM5 to the process module PM6 by the transfer device TMR of the transfer module TM. In step ST4, the second ferromagnetic layer FL2 is formed in the process module PM6. In step ST5, the cap layer CL is formed in the process module PM6. The process module PM6 forms the second ferromagnetic layer FL2 and the cap layer CL by physical vapor deposition (or sputtering).

Figure 8:
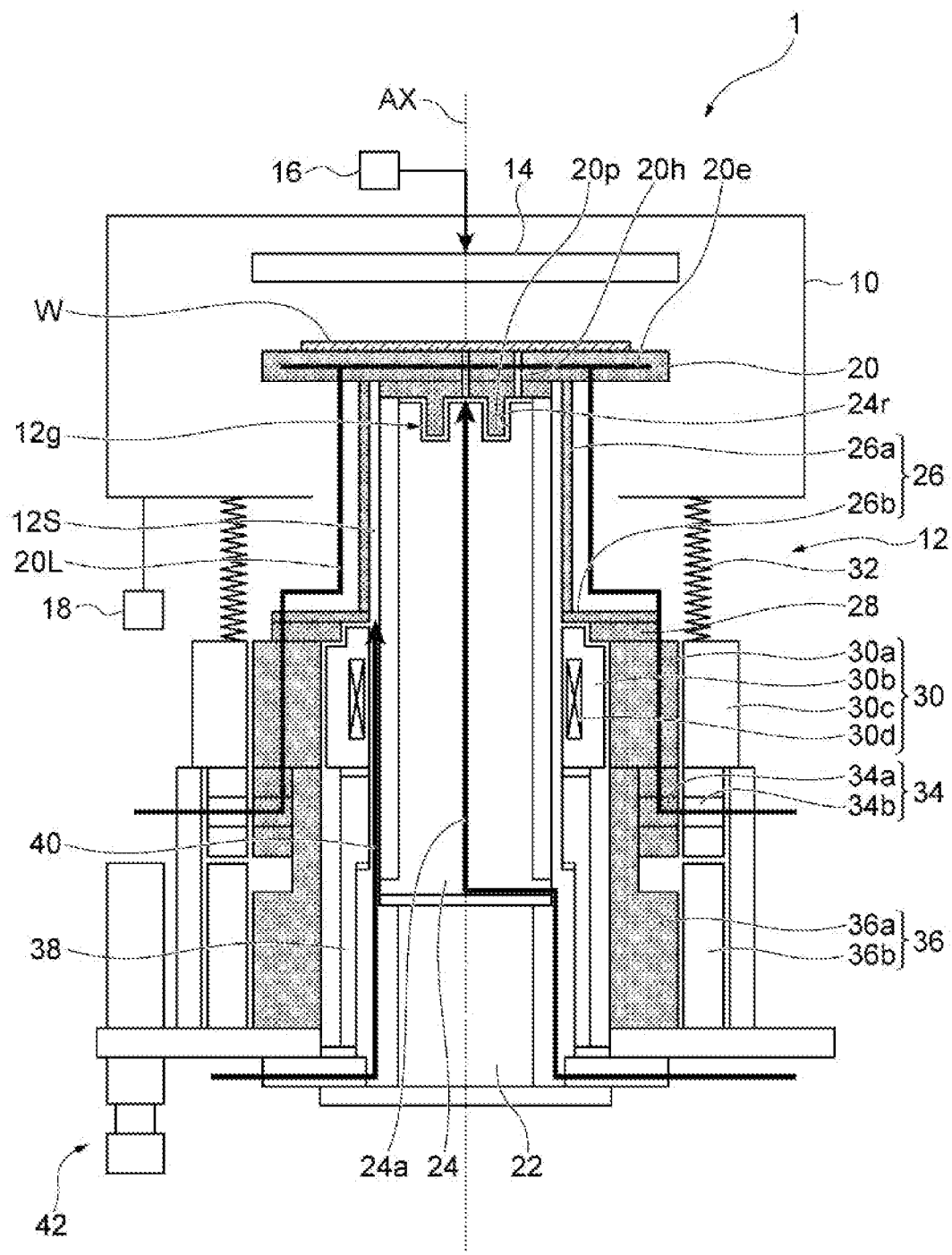
FIG. 8 is a diagram showing an oxidation processing apparatus according to one exemplary embodiment.

An oxidation processing apparatus that can be used in step STb of the method MT will be described below. FIG. 8 is a diagram showing an oxidation processing apparatus according to one exemplary embodiment. An oxidation processing apparatus 1 shown in FIG. 8 can be used in step STb of the method MT.

The oxidation processing apparatus 1 includes a chamber 10, a substrate support mechanism 12, and a gas supply 14. The gas supply 14 is configured to introduce oxygen gas from a gas source 16 into the chamber 10 and supply the oxygen gas to the substrate W. An exhaust device 18 is connected to the chamber 10. The exhaust device 18 includes a pressure controller and a vacuum pump such as a turbomolecular pump or a dry pump. The pressure of the gas in the chamber 10 is regulated by a mass flow controller.

The substrate support mechanism 12 includes a substrate support 20. The substrate support 20 is provided in the chamber 10 and is configured to support the substrate W placed thereon. The substrate support 20 is made of a material with high thermal conductivity such as copper (Cu). The substrate support 20 may include an electrostatic chuck. The electrostatic chuck includes a body formed from a dielectric material and an electrode 20e provided in the body. The electrode 20e is connected to a DC power supply via a wiring 20L. When a voltage from the DC power supply is applied to the electrode 20e, electrostatic attraction is generated between the electrostatic chuck and the substrate. Due to the generated electrostatic attraction, the substrate W is attracted to the electrostatic chuck and held by the electrostatic chuck.

The substrate support mechanism 12 further includes a chiller 22. The substrate support mechanism 12 may further include a heat conductor 24 and an outer cylinder 26. The chiller 22 holds the heat conductor 24 and cools the substrate support 20 to a temperature of ~150 Kelvin or lower via the heat conductor 24. The chiller 22 may be a type that utilizes the Gifford-McMahon (GM) cycle.

The heat conductor 24 is disposed and fixed on the chiller 22. An upper portion of the heat conductor 24 is disposed in the chamber 10. The heat conductor 24 is made of a material with high thermal conductivity such as pure copper (Cu). The heat conductor 24 has a substantially cylindrical shape. The heat conductor 24 is disposed such that its central axis coincides with a central axis AX of the substrate support 20. The heat conductor 24 provides a gas supply 24a inside thereof. The gas supply 24a communicates with a gap 12g, which will be described later. The gas supply 24a supplies a cooling gas (for example, He gas) to the gap 12g.

The substrate support 20 is disposed such that the gap 12g is interposed between an upper surface of the heat conductor 24 and the substrate support 20. The substrate support 20 provides one or more through holes 20h. The one or more through holes 20h communicate with the gap 12g. The cooling gas supplied to the gap 12g is supplied to a gap between an upper surface of the substrate support 20 and a lower surface of the substrate W via the one or more through holes 20h. As a result, the heat transfer efficiency between the substrate support 20 and the substrate W is enhanced, and the substrate W is efficiently cooled. The gap 12g may be filled with thermally conductive grease.

A lower surface of the substrate support 20 includes convex portions 20p protruding downward. The convex portion 20p may have a substantially cylindrical shape and may extend around the central axis AX. The convex portions 20p increase a surface area of the lower surface of the substrate support 20. A surface of the convex portion 20p may be roughened by blasting or the like. The heat transfer efficiency between the substrate support 20 and the heat conductor 24 is enhanced by the convex portions 20p. The lower surface of the substrate support 20 may have a plurality of convex portions such as the convex portions 20p. Further, in the substrate support 20, a portion including the electrostatic chuck and the convex portions 20p may be integrally formed, or may be formed separately and joined to each other.

The upper surface of the heat conductor 24 defines concave portions 24r. The number of concave portions 24r is the same as the number of convex portions 20p of the substrate support 20. The convex portions 20p of the substrate support are disposed in the concave portions 24r such that the gap 12g is interposed between the upper surface of the heat conductor 24 and the convex portions 20p. The upper surface of the heat conductor 24 defining the concave portions 24r may be roughened by blasting or the like. The heat transfer efficiency between the substrate support 20 and the heat conductor 24 is enhanced by the concave portions 24r.

The outer cylinder 26 is provided around the heat conductor 24. The outer cylinder 26 extends around the central axis AX so as to cover the upper portion of the heat conductor 24. An upper end of the outer cylinder 26 is fixed to the substrate support 20. The outer cylinder 26 includes a cylindrical portion 26a and a flange portion 26b. The cylindrical portion 26a and the flange portion 26b are made of metal such as stainless steel. The cylindrical portion 26a has a substantially cylindrical shape and extends around the central axis AX. The cylindrical portion 26a has an inner diameter slightly larger than an outer diameter of the heat conductor 24. The upper portion of the heat conductor 24 is disposed inside the cylindrical portion 26a. The flange portion 26b extends radially outward from a lower end of the cylindrical portion 26a. The flange portion 26b is disposed on a heat insulating member 28.

The heat insulating member 28 has a substantially annular shape. The heat insulating member 28 extends around the central axis AX and is fixed to the flange portion 26b. The heat insulating member 28 is made of ceramics such as alumina. The heat insulating member 28 is provided on a magnetic fluid seal 30.

The magnetic fluid seal 30 has a rotating portion 30a, an inner fixed portion 30b, an outer fixed portion 30c, and a heating portion 30d. The rotating portion 30a has a substantially cylindrical shape and extends around the central axis AX. The rotating portion 30a is fixed to the heat insulating member 28. That is, the rotating portion 30a is connected to the outer cylinder 26 via the heat insulating member 28. The heat insulating member 28 thermally isolates the magnetic fluid seal 30 from the outer cylinder 26. Therefore, deterioration of the sealing performance of the magnetic fluid seal 30 and occurrence of dew condensation on the magnetic fluid seal 30 are suppressed.

The inner fixed portion 30b is provided between the heat conductor 24 and the rotating portion 30a via a magnetic fluid. The inner fixed portion 30b has a substantially cylindrical shape and extends around the central axis AX. An inner diameter of the inner fixed portion 30b is larger than the outer diameter of the heat conductor 24, and an outer diameter of the inner fixed portion 30b is smaller than an inner diameter of the rotating portion 30a. The outer fixed portion 30c is provided outside the rotating portion 30a via a magnetic fluid. The outer fixed portion 30c has a substantially cylindrical shape and extends around the central axis AX. An inner diameter of the outer fixed portion 30c is larger than an outer diameter of the rotating portion 30a. The heating portion 30d is embedded in the inner fixed portion 30b and heats the magnetic fluid seal 30 as a whole. The heating portion 30d suppresses the deterioration of the sealing performance of the magnetic fluid seal 30 and the occurrence of dew condensation on the magnetic fluid seal 30.

In the magnetic fluid seal 30, the rotating portion 30a is rotatable with respect to the inner fixed portion 30b and the outer fixed portion 30c in an airtight state. The outer cylinder 26 connected to the rotating portion 30a is rotatably supported by the magnetic fluid seal 30.

A bellows 32 is provided between the outer fixed portion 30c of the magnetic fluid seal 30 and a bottom of the chamber 10. The bellows 32 is a bellows structure made of metal, and can extend and contract in a vertical direction. The bellows 32 surrounds the heat conductor 24, the outer cylinder 26, and the heat insulating member 28, and separates a space within the chamber 10 from an exterior of the chamber 10 from each other.

The substrate support mechanism 12 may further include a slip ring 34. The slip ring 34 is provided under the magnetic fluid seal 30. The slip ring 34 has a rotating body 34a including a metal ring and a fixed body 34b including a brush. The rotating body 34a has a substantially cylindrical shape and extends around the central axis AX. The rotating body 34a is fixed to the rotating portion 30a of the magnetic fluid seal 30. The fixed body 34b has a substantially cylindrical shape and extends around the central axis AX. The fixed body 34b has an inner diameter slightly larger than an outer diameter of the rotating body 34a. The slip ring 34 is electrically connected to a DC power supply, and transmits power supplied from the DC power supply to the wiring 20L through the brush of the fixed body 34b and the metal ring of the rotating body 34a. The slip ring 34 makes it possible to apply a voltage to the electrode 20e without twisting the wiring 20L. The rotating body 34a of the slip ring 34 is attached to a driving mechanism 36.

The driving mechanism 36 is a direct drive motor and has a rotor 36a and a stator 36b. The rotor 36a has a substantially cylindrical shape and extends around the central axis AX. The rotor 36a is fixed to the rotating body 34a of the slip ring 34. The stator 36b has a substantially cylindrical shape and extends around the central axis AX. An inner diameter of the stator 36b is larger than an outer diameter of the rotor 36a. When the rotor 36a rotates, the rotating body 34a of the slip ring 34, the rotating portion 30a of the magnetic fluid seal 30, the outer cylinder 26, and the substrate support 20 rotate with respect to the heat conductor 24.

The substrate support mechanism 12 may further include a heat insulator 38. The heat insulator 38 is provided around the chiller 22 and the heat conductor 24. The heat insulator 38 is disposed between the chiller 22 and the rotor 36a and between a lower portion of the heat conductor 24 and the rotor 36a. The heat insulator 38 suppresses heat transfer between each of the chiller 22 and the heat conductor 24 and the rotor 36a.

A gas supply 40 may be provided around the chiller 22 and the heat conductor 24. The gas supply 40 supplies cooling gas to a space 12S between the heat conductor 24 and the outer cylinder 26. The cooling gas supplied to the space 12S is a gas different from the gas supplied to the gap 12g. The cooling gas supplied to the space 12S may have a thermal conductivity lower than that of the gas supplied to the gap 12g. Further, the pressure of the cooling gas supplied to the space 12S may be higher than the pressure of the gas supplied to the gap 12g. The cooling gas supplied to the space 12S may be low boiling point gas such as argon and neon.

The substrate support mechanism 12 may include one or more temperature sensors in order to detect the temperature of the heat conductor 24, the gap 12g, and the like. The one or more temperature sensors may be low-temperature temperature sensors such as silicon diode temperature sensors, platinum resistance temperature sensors, and the like.

The oxidation processing apparatus 1 may further include a hoisting and lowering mechanism 42. The hoisting and lowering mechanism 42 hoists and lowers the substrate support mechanism 12 with respect to the chamber 10. The hoisting and lowering mechanism 42 can adjust a distance between the gas supply 14 and the substrate support 20.

The oxidation processing apparatus 1 is configured to supply oxygen gas into the chamber 10 from the gas supply 14 in a state in which the substrate support 20 on which the substrate W having the first magnesium layer ML1 is placed has been cooled to a temperature of 150 Kelvin or less. Therefore, according to the oxidation processing apparatus 1, it is possible to suppress oxidation of the first ferromagnetic layer FL1 underlying the first magnesium layer ML1.

While various exemplary embodiments have been described above, the present disclosure is not limited to the above embodiments, various additions, omissions, substitutions, and modifications may be made without being limited to the exemplary embodiments described above. Further, elements from different embodiments can be combined to form other embodiments.

Figure 9:
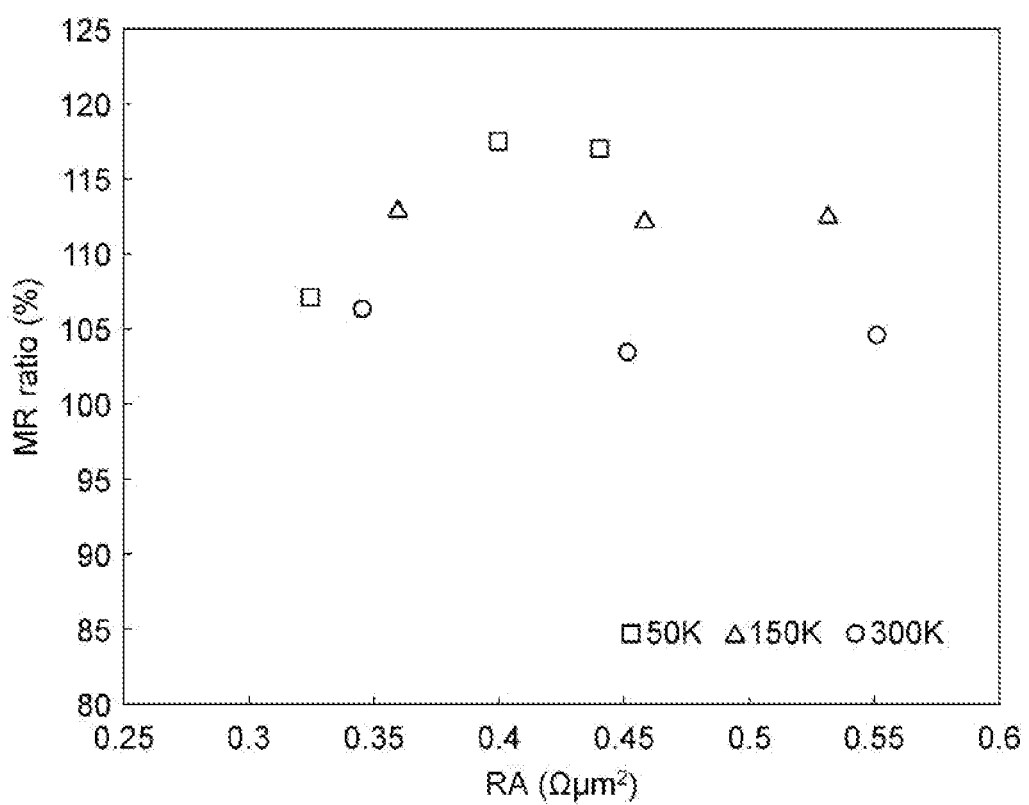
FIG. 9 is a graph showing experimental result.

An experiment performed to evaluate the method MT are described below. In the experiment, a plurality of magnetoresistive elements having the same structure as the structure shown in FIG. 2 were produced by the method MT. In the experiment, three temperatures of 50 K (Kelvin), 150 K, and 300 K were used as the temperature of the substrate support in step STb of the method MT. That is, in the production of the plurality of magnetoresistive elements, the temperature of the substrate support in step STb was set to any one of 50 K (Kelvin), 150 K, and 300 K. In the experiment, the resistance area product (RA) and the MR ratio of each of the plurality of magnetoresistive elements produced were obtained. The results are shown in FIG. 9. As shown in FIG. 9, when the temperature of the substrate support in step STb was 150 K or less, a magnetoresistive element having a considerably high MR ratio was obtained.

From the above description, it will be appreciated that various embodiments of the present disclosure have been described herein for purposes of illustration, and that various changes may be made without departing from the scope and spirit of the present disclosure. Therefore, the various embodiments disclosed herein are not intended to be limiting, with a true scope and spirit being indicated by the following claims.

DESCRIPTION OF REFERENCE NUMERALS

PS: substrate processing system, PM1 to PM6: process modules, TM: transfer module, 1: oxidation processing apparatus, 10: chamber, 14: gas supply, 20: substrate support, 22: chiller, W: substrate, FL1: first ferromagnetic layer, ML1: first magnesium layer, MOL1: first magnesium oxide layer

The invention claimed is:

1. A method of manufacturing a magnetoresistive element, the method comprising:
   (a) placing a substrate on a substrate support of an oxidation processing apparatus, the substrate having a ferromagnetic layer and a magnesium layer provided on the ferromagnetic layer;
   (b) oxidizing the magnesium layer by supplying oxygen gas to the substrate in a state where a temperature of the substrate support is set to 150 Kelvin or less to form a magnesium oxide layer from the magnesium layer;
   (c) increasing a temperature of the substrate after the (b);
   (d) forming another magnesium layer on the magnesium oxide layer after the (c); and
   (e) supplying oxygen gas to the substrate having said another magnesium layer to oxidize said another magnesium layer,
   wherein a temperature of the substrate in the (e) is higher than the temperature of the substrate in the (b).

2. The method of claim 1, wherein in the (b), the substrate is rotated.

3. A substrate processing system comprising:
   a plurality of process modules; and
   a transfer module comprising a vacuum chamber connected to the plurality of process modules and a transfer device configured to transfer a substrate via the vacuum chamber between any two process modules of the plurality of process modules;
   wherein the plurality of process modules comprises:
   a film forming apparatus configured to form a magnesium layer on a ferromagnetic layer of the substrate; and
   an oxidation processing apparatus comprising:
      a chamber;
      a substrate support configured to support a substrate in the chamber;
      a chiller configured to cool the substrate support to a temperature of 150 Kelvin or less; and
      a gas supply configured to supply oxygen gas into the chamber, the oxidation processing apparatus being configured to supply oxygen gas to the substrate in the chamber from the gas supply in a state where a temperature of the substrate support, on which the substrate having a ferromagnetic layer and a magnesium layer provided on the ferromagnetic layer is placed, is set to 150 Kelvin or less to form a magnesium oxide layer from the magnesium layer,
   wherein the plurality of process modules comprise one or more process modules configured to heat the substrate, form another magnesium layer on the magnesium oxide layer, and oxidize said another magnesium layer, and
   the one or more process modules are configured to set a temperature of the substrate to a temperature higher than the temperature of the substrate in the oxidation processing apparatus.

4. The substrate processing system of claim 3, wherein the oxidation processing apparatus further comprises:
   a driving mechanism configured to rotate the substrate support.

* * * * *